(12) United States Patent
Otremba

(10) Patent No.: US 8,987,879 B2
(45) Date of Patent: Mar. 24, 2015

(54) SEMICONDUCTOR DEVICE INCLUDING A CONTACT CLIP HAVING PROTRUSIONS AND MANUFACTURING THEREOF

(75) Inventor: Ralf Otremba, Kaufbeuren (DE)

(73) Assignee: Infineon Technologies AG, Neubiberg (DE)

( * ) Notice: Subject to any disclaimer, the term of this patent is extended or adjusted under 35 U.S.C. 154(b) by 191 days.

(21) Appl. No.: 13/177,110

(22) Filed: Jul. 6, 2011

(65) Prior Publication Data

US 2013/0009295 A1 Jan. 10, 2013

(51) Int. Cl.
*H01L 23/495* (2006.01)
*H01L 23/00* (2006.01)
*H01L 23/31* (2006.01)

(52) U.S. Cl.
CPC .... *H01L 23/49562* (2013.01); *H01L 23/49524* (2013.01); *H01L 24/37* (2013.01); *H01L 24/73* (2013.01); *H01L 24/83* (2013.01); *H01L 24/92* (2013.01); *H01L 24/97* (2013.01); *H01L 24/34* (2013.01); *H01L 2924/12044* (2013.01); *H01L 23/49513* (2013.01); *H01L 24/48* (2013.01); *H01L 2224/32245* (2013.01); *H01L 2224/48247* (2013.01); *H01L 2224/73265* (2013.01); *H01L 2924/01327* (2013.01); *H01L 2924/13091* (2013.01); *H01L 2924/01029* (2013.01); *H01L 2224/8346* (2013.01); *H01L 2224/92165* (2013.01); *H01L 2224/37011* (2013.01); *H01L 23/3107* (2013.01); *H01L 24/06* (2013.01); *H01L 24/27* (2013.01); *H01L 24/29* (2013.01); *H01L 24/32* (2013.01); *H01L 24/33* (2013.01); *H01L 24/40* (2013.01); *H01L 24/45* (2013.01); *H01L 2224/04026* (2013.01); *H01L 2224/04042* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/05666* (2013.01); *H01L 2224/05669* (2013.01); *H01L 2224/05671* (2013.01); *H01L 2224/06181* (2013.01); *H01L 2224/2745* (2013.01); *H01L 2224/29111* (2013.01); *H01L 2224/29139* (2013.01); *H01L 2224/29144* (2013.01);

(Continued)

(58) Field of Classification Search
USPC .................................................. 257/713, 718
See application file for complete search history.

(56) References Cited

U.S. PATENT DOCUMENTS 7,745,929 B2   6/2010  Otremba
2007/0200250 A1*  8/2007  Koenigsberger et al. ..... 257/778

(Continued)

FOREIGN PATENT DOCUMENTS

DE   103 39 462 A1   3/2005
DE   10 2005 052 563 A1   5/2007
DE   10 2005 057 401 A1   5/2007

*Primary Examiner* — David Vu
*Assistant Examiner* — Jonathan Han
(74) *Attorney, Agent, or Firm* — Slater & Matsil, L.L.P.

(57) ABSTRACT

A semiconductor device includes a leadframe with a die pad and a first lead, a semiconductor chip with a first electrode, and a contact clip with a first contact area and a second contact area. The semiconductor chip is placed over the die pad. The first contact area is placed over the first lead and the second contact area is placed over the first electrode of the semiconductor chip. A plurality of protrusions extends from each of the first and second contact areas and each of the protrusions has a height of at least 5 μm.

22 Claims, 11 Drawing Sheets

(52) U.S. Cl.
CPC ............... *H01L 2224/29147* (2013.01); *H01L 2224/33181* (2013.01); *H01L 2224/37147* (2013.01); *H01L 2224/45124* (2013.01); *H01L 2224/45144* (2013.01); *H01L 2224/45147* (2013.01); *H01L 2224/73215* (2013.01); *H01L 2224/73221* (2013.01); *H01L 2224/73263* (2013.01); *H01L 2224/83191* (2013.01); *H01L 2224/83192* (2013.01); *H01L 2224/83385* (2013.01); *H01L 2224/83439* (2013.01); *H01L 2224/83444* (2013.01); *H01L 2224/83447* (2013.01); *H01L 2224/83455* (2013.01); *H01L 2224/8381* (2013.01); *H01L 2224/8382* (2013.01); *H01L 2224/83986* (2013.01); *H01L 2224/92147* (2013.01); *H01L 2224/92246* (2013.01); *H01L 2224/92247* (2013.01); *H01L 2224/94* (2013.01); *H01L 2224/97* (2013.01); *H01L 2924/10253* (2013.01); *H01L 2924/10271* (2013.01); *H01L 2924/10272* (2013.01); *H01L 2924/10329* (2013.01); *H01L 2924/1305* (2013.01); *H01L 2924/13055* (2013.01); *H01L 2924/13062* (2013.01); *H01L 2924/14* (2013.01); *H01L 2924/1431* (2013.01); *H01L 2924/1434* (2013.01); *H01L 2924/1461* (2013.01); *H01L 2924/19105* (2013.01); *H01L 2224/40247* (2013.01); *H01L 2224/92157* (2013.01); *H01L 2224/92166* (2013.01); *H01L 2224/3716* (2013.01); *H01L 2224/48724* (2013.01); *H01L 2224/48599* (2013.01); *H01L 2224/48799* (2013.01); *H01L 2224/48624* (2013.01); *H01L 2224/48644* (2013.01); *H01L 2224/48647* (2013.01); *H01L 2224/48664* (2013.01); *H01L 2224/48669* (2013.01); *H01L 2224/48671* (2013.01); *H01L 2924/01015* (2013.01); *H01L 2924/01047* (2013.01); *H01L 2224/48091* (2013.01)
USPC ............ 257/676; 257/E23.037; 257/E21.509; 438/123

(56) References Cited

U.S. PATENT DOCUMENTS

| | | |
|---|---|---|
| 2007/0266558 A1 | 11/2007 | Otremba |
| 2007/0290365 A1* | 12/2007 | Reisinger .................... 257/777 |
| 2008/0105907 A1 | 5/2008 | Otremba et al. |
| 2008/0169537 A1* | 7/2008 | Kajiwara et al. .............. 257/666 |
| 2009/0039484 A1* | 2/2009 | Mahler et al. ................ 257/676 |

* cited by examiner

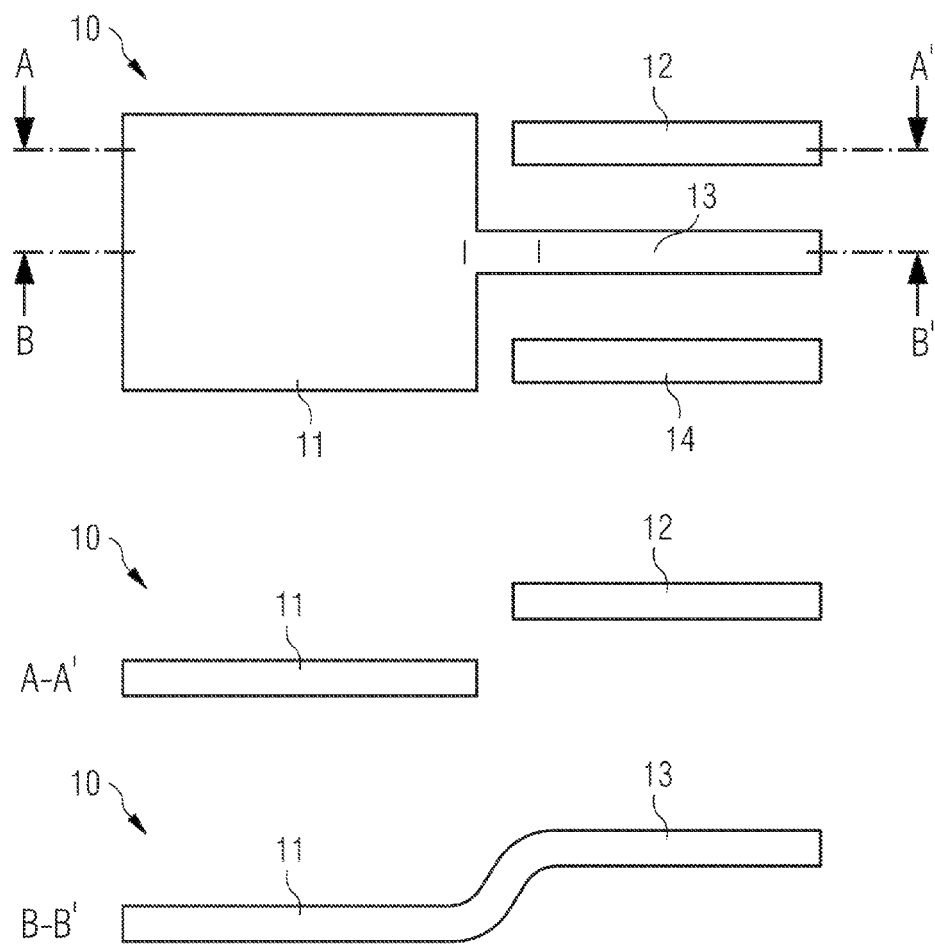

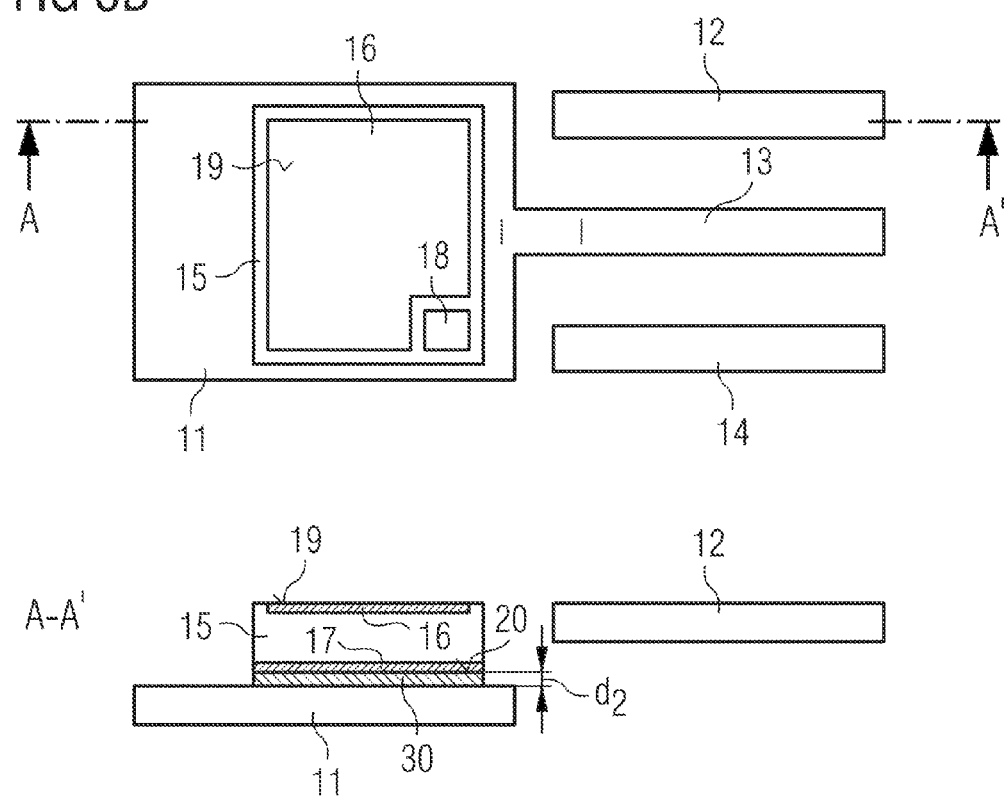

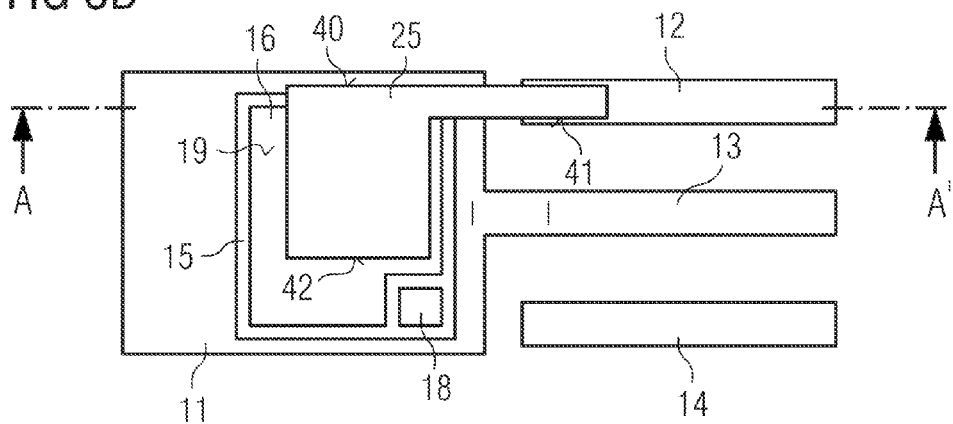
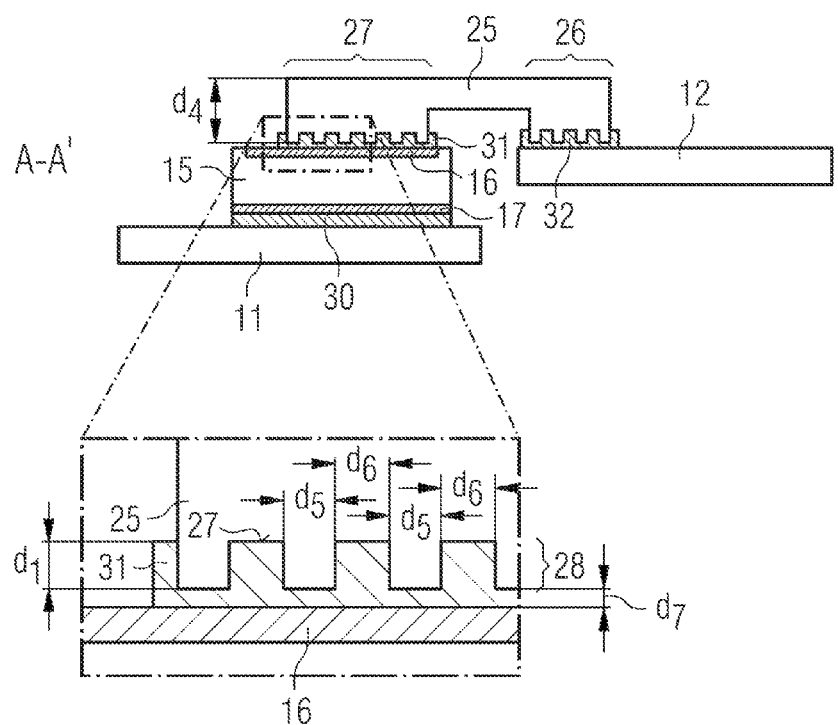

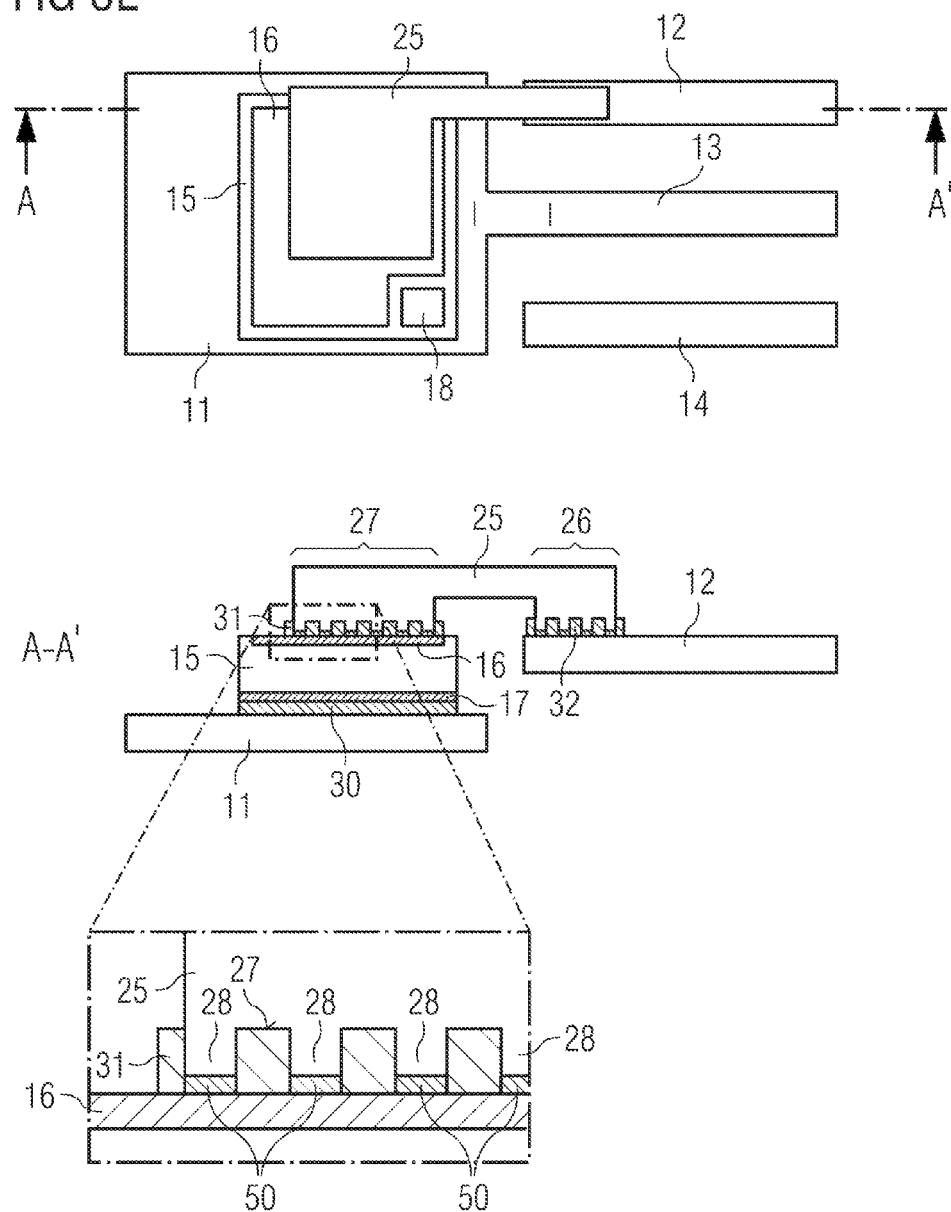

SEMICONDUCTOR DEVICE INCLUDING A CONTACT CLIP HAVING PROTRUSIONS AND MANUFACTURING THEREOF

TECHNICAL FIELD

This invention relates to a semiconductor device including a contact clip having protrusions and a method of manufacturing thereof.

BACKGROUND

Semiconductor device manufacturers are constantly striving to increase the performance of their products, while decreasing their cost of manufacture. A cost intensive area in the manufacture of semiconductor devices is packaging the semiconductor chips. As those skilled in the art are aware, integrated circuits are fabricated in wafers, which are then singulated to produce semiconductor chips. One or more semiconductor chips are placed in a package to protect them from environmental and physical stresses. Packaging also involves electrically coupling the semiconductor chips to a leadframe. This may be accomplished by using various coupling techniques, such as wire bonding, soldering or gluing. Further, contact clips may be used to electrically couple electrodes of the semiconductor chips to the leadframe.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 3A-3H schematically illustrate a cross-sectional view of one embodiment of a method of manufacturing a semiconductor device including attaching a semiconductor chip to a die pad by means of diffusion soldering and coupling the semiconductor chip to a lead by using a contact clip having a plurality of protrusions extending from contact areas;

DETAILED DESCRIPTION OF ILLUSTRATIVE EMBODIMENTS

Figure 1:
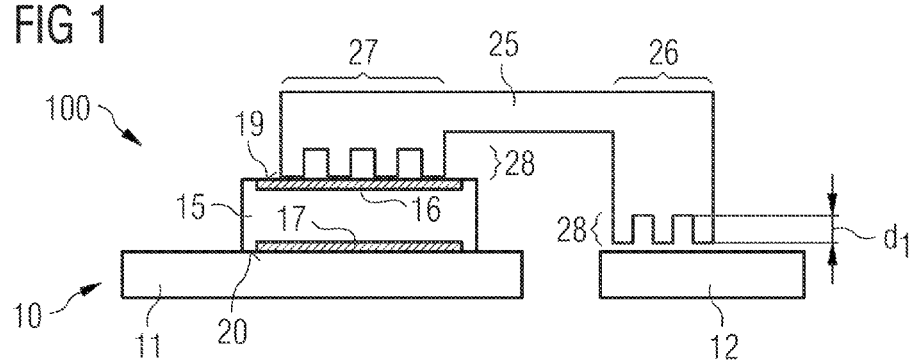
FIG. 1 schematically illustrates a cross-sectional view of one embodiment of a semiconductor device including a semiconductor chip mounted on a die pad and a contact clip electrically coupling the semiconductor chip to a lead.

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

Devices containing one or more semiconductor chips are described below. The semiconductor chips may be of different types, may be manufactured by different technologies and may include, for example, integrated electrical, electro-optical or electro-mechanical circuits or passives. The integrated circuits may, for example, be designed as logic integrated circuits, analog integrated circuits, mixed signal integrated circuits, power integrated circuits, memory circuits or integrated passives. Furthermore, the semiconductor chips may be configured as so-called MEMS (micro-electro mechanical systems) and may include micro-mechanical structures, such as bridges, membranes or tongue structures. The semiconductor chips may be configured as sensors or actuators, for example, pressure sensors, acceleration sensors, rotation sensors, magnetic field sensors, electro-magnetic field sensors, microphones etc. The semiconductor chips need not be manufactured from specific semiconductor material, for example, Si, SiC, SiGe, GaAs, and, furthermore, may contain inorganic and/or organic materials that are not semiconductors, such as, for example, insulators, plastics or metals. Moreover, the semiconductor chips may be packaged or unpackaged.

In particular, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure has electrodes on its two main surfaces, that is to say on its top side and bottom side. In particular, power semiconductor chips may have a vertical structure. The vertical power semiconductor chips may, for example, be configured as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. By way of example, the source electrode and gate electrode of a power MOSFET may be situated on one main surface, while the drain electrode of the power MOSFET is arranged on the other main surface. Furthermore, the devices described below may include integrated circuits to control the integrated circuits of power semiconductor chips.

The semiconductor chips may have electrodes (or contact elements or contact pads) which allow electrical contact to be made with the integrated circuits included in the semiconductor chips. The electrodes may include one or more metal layers that are applied to the semiconductor material. The metal layers may be manufactured with any desired geometric shape and any desired material composition. The metal layers may, for example, be in the form of a layer covering an area. Any desired metal or metal alloy, for example, aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible.

The semiconductor chips may be placed on leadframes. The leadframes may be of any shape, size and material. The leadframes may include die pads and leads. During the fabrication of the devices the die pads and leads may be connected to each other. The die pads and leads may also be made from one piece. The die pads and leads may be connected among each other by connection means with the purpose of separating some of the die pads and leads in the course of the fabrication. Separation of the die pads and leads may be carried out by mechanical sawing, a laser beam, cutting, stamping, milling, etching or any other appropriate method. The leadframes may be electrically conductive. They may be entirely fabricated from metals or metal alloys, in particular copper, copper alloys, iron nickel, aluminum, aluminum alloys, steel, stainless steel or other appropriate materials. The leadframes may be plated with an electrically conductive material, for example copper, silver, iron nickel or nickel phosphorus. The leads of the leadframes may be bent during fabrication, for example, in an S-shaped manner.

One or more contact clips may be used to electrically couple components to each other within the device. For example, an electrode of a semiconductor chip may be electrically coupled to an external contact element, for example, the lead of a leadframe by a contact clip. Each of the contact clips has at least two contact areas, which are used to attach the contact clip to at least two components of the device. The contact areas include protrusions extending towards the components the contact clip is attached to. Each of the protrusions may have a height of at least 5 µm. Due to the protrusions the contact areas of the contact clip may have a comb structure. Thus, the contour of the contact areas include peaks and valleys, which may extend from one side surface of the contact clip to another side surface of the contact clip. The widths of the peaks and/or the widths of the valleys may be regular or, alternatively, irregular. Further, the heights of the peaks may be regular or, alternatively, irregular. The contact clip may be soldered to the components. For this, a diffusion soldering process may be used.

The devices described below include external contact elements (or external contact pads), which may be of any shape and size. The external contact elements may be accessible from outside the device and may thus allow electrical contact to be made with the semiconductor chips from outside the device. For this reason, the external contact elements may have external contact surfaces which can be accessed from outside the device. Furthermore, the external contact elements may be thermally conductive and may serve as heat sinks for dissipating the heat generated by the semiconductor chips. The external contact elements may be composed of any desired electrically conductive material, for example, of a metal, such as copper, aluminum or gold, a metal alloy or an electrically conducting organic material. Some of the external contact elements may be leads of a leadframe.

The devices may include an encapsulation material, for example, a mold material covering at least parts of the components of the devices. The mold material may be any appropriate thermoplastic or thermosetting material. Various techniques may be employed to cover the components with the mold material, for example, compression molding, injection molding, powder molding or liquid molding.

The devices may have mounting surfaces. The mounting surface may serve to mount the device onto another component, for example, a circuit board, such as a PCB (printed circuit board). External contact elements and, in particular, external contact surfaces may be disposed on the mounting surface to allow to electrically couple the device to the component on which the device is mounted. Solder deposits, such as solder balls, or other appropriate connection elements may be used to establish an electrical and, in particular, mechanical connection between the device and the component on which the device is mounted.

FIG. 1 schematically illustrates a cross-sectional view of a semiconductor device 100. The semiconductor device 100 includes a leadframe 10 consisting of at least a die pad 11 and a first lead 12. The semiconductor device 100 further includes a semiconductor chip 15, which has a first electrode 16 and a second electrode 17. The first electrode 16 is arranged on a first surface 19 of the semiconductor chip 15, and the second electrode 17 is arranged on a second surface 20 of the semiconductor chip 15. The second surface 20 is opposite to the first surface 19. A contact clip 25 having a first contact area 26 and a second contact area 27 is placed such that the first contact area 26 is placed over the first lead 12 and the second contact area 27 is placed over the first electrode 16 of the semiconductor chip 15. Protrusions 28 extend from each of the first and second contact area 26, 27. Each of the protrusions 28 has a height $d_1$ of at least 5 µm.

Figure 2A:
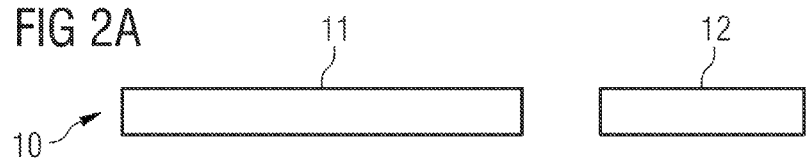
FIGS. 2A-2C schematically illustrate a cross-sectional view of one embodiment of a method including attaching a contact clip to a semiconductor chip and a lead by means of diffusion soldering.
Figure 2B:
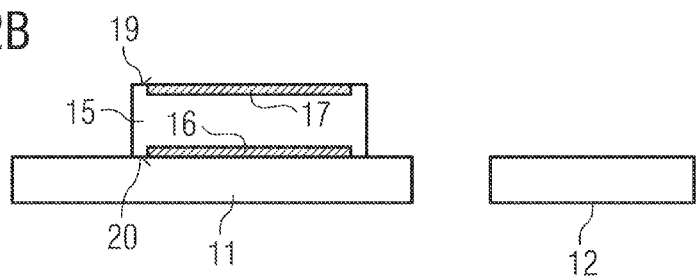
Figure 2C:
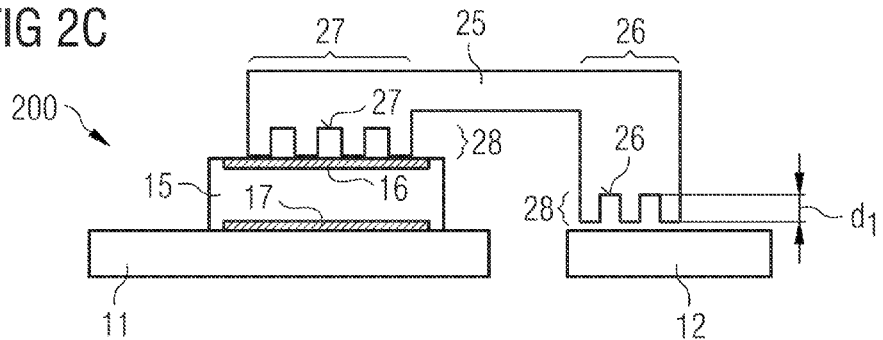

FIGS. 2A-2C schematically illustrate a method of manufacturing a semiconductor device 200, which is illustrated in FIG. 2C in a cross-sectional view.

As illustrated in FIG. 2A, a leadframe 10 consisting of at least a die pad 11 and a first lead 12 is provided. A semiconductor chip 15 having a first electrode 16 on a first surface 19 and a second electrode 17 on a second surface 20 is mounted on the die pad 11 using a diffusion soldering process as illustrated in FIG. 2B. A contact clip 25 is attached to the first lead 12 and the first electrode 16 of the semiconductor chip 15 by using a diffusion soldering process as illustrated in FIG. 2C. The contact clip 25 has two contact areas 26, 27 with protrusions 28 extending from the contact area 26, 27 and having a height $d_1$ of at least 5 µm.

Figure 3C:
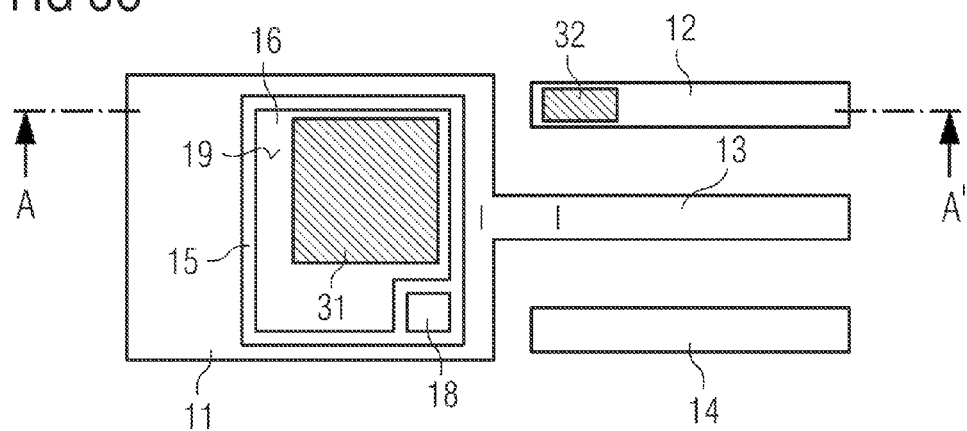
Figure 3C:
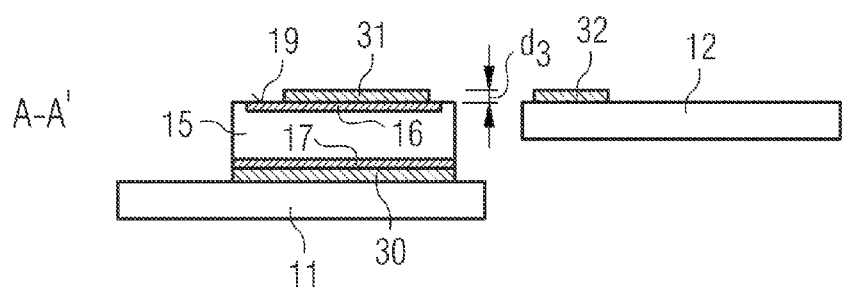
Figure 3F:
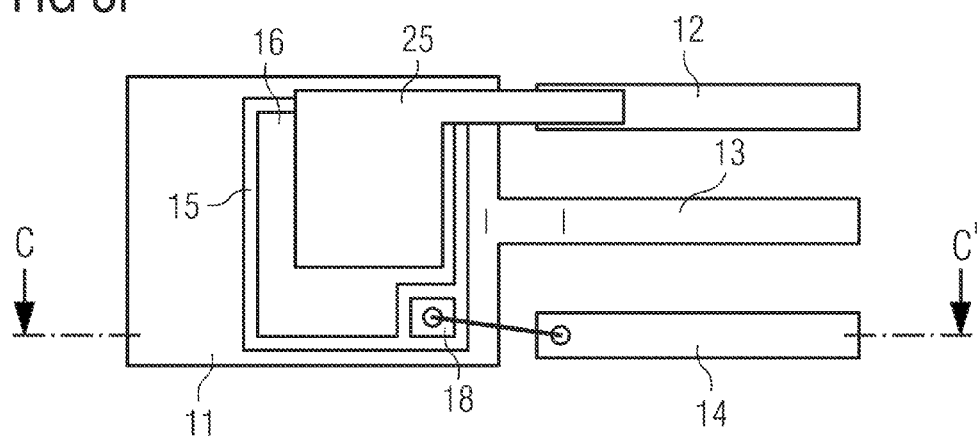
Figure 3F:
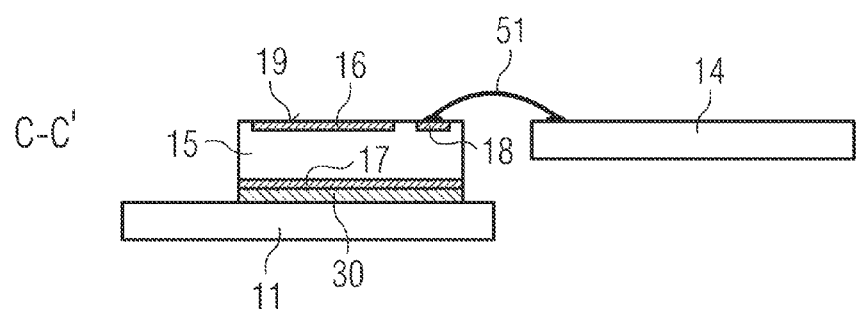
Figure 3G:
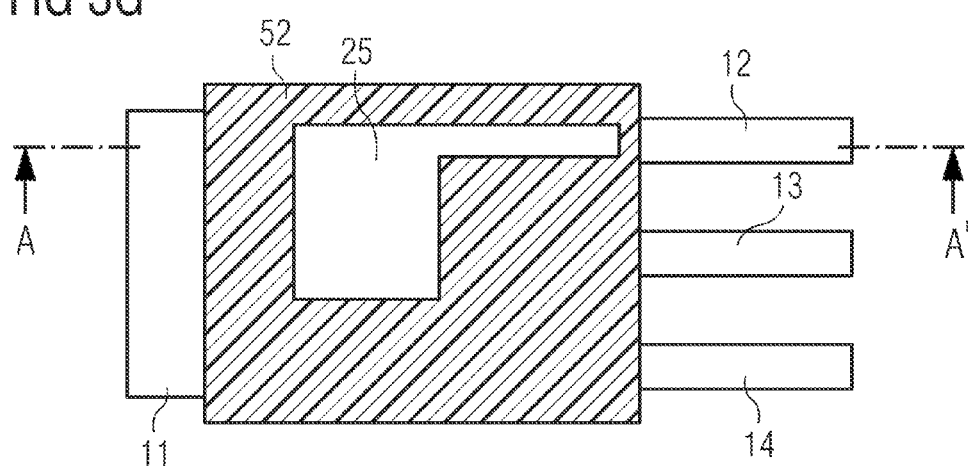
Figure 3G:
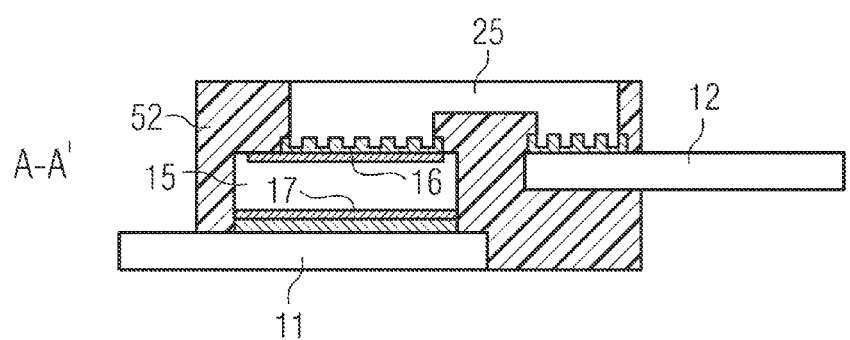
Figure 3H:
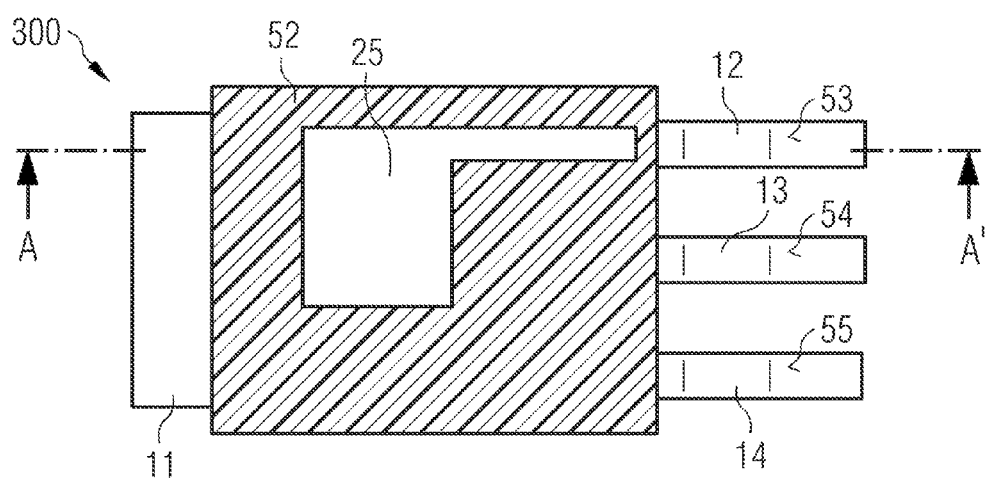
Figure 3H:
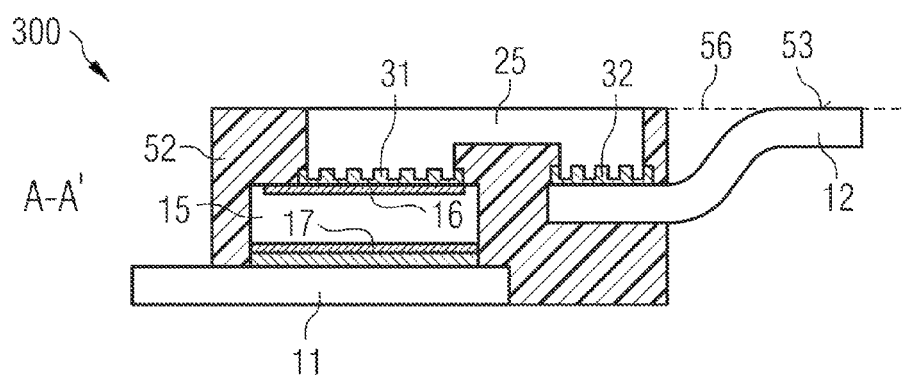

FIGS. 3A-3H, collectively FIG. 3, schematically illustrate an embodiment of a method of manufacturing a semiconductor device 300, which is illustrated in FIG. 3H. The device 300 is an implementation of the devices 100 and 200 shown in FIGS. 1 and 2C. The details of the device 300 that are described below can therefore be likewise applied to the devices 100 and 200. Furthermore, the details of the manufacturing method that are described below can be likewise applied to the manufacturing method illustrated in FIGS. 2A-2C. Similar or identical components of the devices 100, 200 and 300 are denoted by the same reference numerals.

FIG. 3A schematically illustrates a leadframe 10. The leadframe 10 is illustrated in a top plan view (top), a cross-sectional view (middle) along the line A-A' depicted in the top plan view and a cross-sectional view (bottom) along the line B-B' depicted in the top plan view. The leadframe 10 includes a die pad 11, a first lead 12, a second lead 13 and a third lead 14. The leads 12-14 protrude essentially in parallel from one side of the die pad 11. The second lead 13 is contiguous with one side of the die pad 11. The die pad 11 and the leads 12-14 may be linked by dams (tie bars), which are not illustrated in FIG. 3A for reasons of clarity. As illustrated in the cross-sectional views of FIG. 3A, the leads 12-14 are arranged in a different plane than the die pad 11, but may alternatively be arranged in the same plane.

In one embodiment, the leadframe 10 includes further die pads and leads. In one embodiment, the leads 12-14 are arranged on different sides of the die pad 11.

The leadframe 10 is manufactured from metals or metal alloys, in particular copper, copper alloys, iron nickel, aluminum, aluminum alloys, or other electrically conductive materials. In one embodiment, the leadframe 10 is plated with an electrically conductive material, for example, copper, silver, iron nickel or nickel phosphorus. The shape of the leadframe 10 is not limited to any size or geometric shape. For example, the leadframe 10 may have a thickness in the range from 100 µm to 1 mm or may be even thicker. The leadframe 10 may have been manufactured by punching, milling or stamping a metallic plate.

FIG. 3B schematically illustrates a semiconductor chip 15, which is a power semiconductor chip and is mounted on the die pad 11. In one embodiment, further power semiconductor chips are mounted on further die pads of the leadframe 10, which are not illustrated in FIG. 3B.

The semiconductor chip 15 is mounted on the die pad 11 with its second surface 20 facing the die pad 11 and its first surface 19 facing away from the die pad 11. The semiconductor chip 15 has a first electrode 16 on the first surface 19 and a second electrode 17 on the second surface 20. The first and second electrodes 16, 17 are load electrodes. Furthermore, the semiconductor chip 15 has a third electrode 18 on its first surface 19. The third electrode 18 is a control electrode. The top surface of the die pad 11 is larger than the second surface 20 of the semiconductor chip 15.

The semiconductor chip 15 is configured as a power transistor, for example, a power MOSFET, IGBT, JFET or power bipolar transistor, or a power diode. In the case of a power MOSFET or a JFET, the first electrode 16 is a source electrode, the second electrode 17 is a drain electrode, and the third electrode 18 is a gate electrode. In the case of an IGBT, the first electrode 16 is an emitter electrode, the second electrode 17 is a collector electrode, and the third electrode 18 is a gate electrode. In the case of a power bipolar transistor, the first electrode 16 is an emitter electrode, the second electrode 17 is a collector electrode, and the third electrode 18 is a base electrode. In the case of a power diode, the first and second electrodes 16, 17 are cathode and anode, and there is no third electrode. During operation, voltages higher than 5, 50, 100, 500 or 1000 V may be applied between the first and second electrodes 16, 17. The switching frequency applied to the third electrode 18 may be in the range from 1 kHz to 100 MHz, but may also be outside this range.

The second electrode 17 is electrically and mechanically coupled to the die pad 11 by diffusion soldering. For that, a solder material 30 is deposited on the second electrode 17 or the upper surface of the die pad 11, for example, by sputtering or other appropriate physical or chemical deposition methods. In one embodiment, the solder material 30 is deposited on the second electrode 17 when the semiconductor chip 15 is still in the wafer bond, which means that the solder material 30 is deposited on the semiconductor wafer before the semiconductor wafer is singulated in order to produce individual semiconductor chips. In one embodiment, the solder material 30 consists of AuSn, AgSn, CuSn, Sn, AuIn, AgIn, AuSi or CuIn.

For producing the soldered joint, the leadframe 10 is heated by a hot plate to a temperature above the melting temperature of the solder material 30. For example, the leadframe 10 is heated to a temperature in the range from 200 to 400° C. and, in particular, in the range from 280 to 320° C. In one embodiment, both the leadframe 10 and the semiconductor chip 15 are placed in an oven and are heated to an appropriate temperature. A pick-and-place tool is used capable of picking the semiconductor chip 15 and placing it on the die pad 11. During the soldering process the semiconductor chip 15 may be pressed onto the die pad 11 for an appropriate time in the range from 10 to 200 ms, in particular around 50 ms.

During the diffusion soldering process the solder material 30 produces a metallic joint between the die pad 11 and the semiconductor chip 15 which is able to withstand high temperatures through the fact that the solder material 30 forms a temperature-resistant and highly mechanically stable intermetallic phase with high-melting materials of the die pad 11 and the semiconductor chip 15. The intermetallic phase has a higher melting temperature than the solder material 30 used to generate the intermetallic phase. In the process, the low-melting solder material 30 is completely transformed, i.e. it passes completely into the intermetallic phase. The process is diffusion-controlled and its duration increases as the thickness of the layer of the solder material 30 rises. In one embodiment, the gap $d_2$ between the die pad 11 and the semiconductor chip 15 is smaller than 1 µm after the soldering process.

FIG. 3C schematically illustrates layers 31 and 32 of solder material which are deposited on at least portions of the first electrode 16 of the semiconductor chip 15 and the upper surface of the first lead 12, respectively. In one embodiment, the layers 31, 32 of solder material are deposited after the soldered joint between the die pad 11 and the semiconductor chip 15 has been formed. The layers 31, 32 of solder material are deposited by using printing, dispensing or any other appropriate technique. The layers 31, 32 of solder material have a thickness $d_3$ in the range from 5 to 10 µm. In one embodiment, the layers 31, 32 of solder material are deposited on contact areas of the first electrode 16 and the first lead 12, respectively, where a contact clip is placed later on. In one embodiment, the first electrode 16 of the semiconductor chip 15 is coated with a layer of nickel or copper or any other metal or metal alloy which allows to produce a soldered joint in a diffusion soldering process. This layer has a thickness in the range from 0.5 to 5 µm. In addition, a layer of silver or gold may be deposited on the nickel or copper layer having a thickness in the range from 10 to 200 nm. The silver or gold layer prevents the nickel or copper layer from oxidation.

FIG. 3D schematically illustrates a contact clip 25 which is placed over the first lead 12 and the semiconductor chip 15. The contact clip 25 has a first contact area 26 which faces the first lead 12 and a second contact area 27 which faces the first electrode 16 of the semiconductor chip 15. Protrusions 28 extend from each of the first and second contact area 26, 27. Each of the protrusions 28 has a height $d_1$ of at least 5 µm and, in particular, in the range from 5 to 10 µm. In one embodiment, the height $d_1$ of the protrusions 28 is 1 to 2 µm smaller than the height $d_3$ of the layers 31, 32 of solder material. If the height $d_3$ is, for example, 10 µm, then the height $d_1$ is 8 to 9 µm. The protrusions 28 may, for example, have an essentially rectangular shape as shown in FIG. 3D, but may also have any other appropriate shape. In one embodiment, the protrusions 28 form peaks and valleys on the contact areas 26, 27, which extend from a side surface 40 of the contact clip 25 to a side surface 41 opposite to the side surface 40 in the first contact area 26. In the second contact area 27, the peaks and valleys extend from the side surface 40 to a side surface 42 of the contact clip 25. In one embodiment, the peaks and valleys extend in a direction orthogonal to the aforementioned direction or in any other direction.

The contact clip 25 may be manufactured from a metal or a metal alloy, in particular, copper, copper alloys, iron nickel or other appropriate electrically conductive materials. The shape of the contact clip 25 is not limited to any size or geometric shape. The contact clip 25 may have the shape as exemplarily illustrated in FIG. 3D, but any other shape is also possible. In one embodiment, the contact clip 25 has a thickness $d_4$ in the range from 100 to 200 µm. The contact clip 25 is fabricated by stamping, punching, pressing, cutting, sawing, milling or any other appropriate technique. The contact areas 26, 27 including the protrusions 28 are fabricated by stamping, punching, etching or any other appropriate technique. In one embodiment, the protrusions 28 have a width $d_5$ in the range from 10 to 100 µm. In one embodiment, a distance $d_6$ between neighboring protrusions is in the range from 10 to 100 µm.

FIG. 3D also illustrates an enlarged portion of the interface between the second contact area 27 of the contact clip 25 and the first electrode 16 of the semiconductor chip 15. As can be seen from this illustration, the contact clip 25 is pressed in the layer 31 of solder material such that there is a gap $d_7$ between the bottom surface of the protrusions 28 and the top surface of the first electrode 16 in the range from 1 to 2 µm. In one embodiment, the space between adjacent protrusions 28 is completely filled with solder material. The interface between the first contact area 26 of the contact clip 25 and the first lead 12 is similar to the interface between the second contact area 27 and the first electrode 16. The gap between the protrusions 28 and the first lead 12 is also in the range from 1 to 2 µm.

FIG. 3E schematically illustrates that the leadframe 10 together with the semiconductor chip 15 and the contact clip 25 are placed in an oven. In the oven, the components are exposed to a temperature which is higher than the melting temperature of the solder material of the layers 31 and 32. The melting temperature of the solder material may be lower than 260° C. and, in particular, may be around 230° C. The temperature in the oven may be in the range from 280 to 320° C. and, in particular, around 300° C. In one embodiment, the components are placed in the oven for not longer than 60 seconds and, in particular, for 30 to 60 seconds.

In the oven, a diffusion soldering process is carried out. During the diffusion soldering process the solder material produces metallic joints between the first contact area 26 and the first lead 12 and between the second contact area 27 and the first electrode 16, which are able to withstand high temperatures through the fact that the solder material forms temperature-resistant and highly mechanically stable intermetallic phases 50 with high-melting materials of the contact clip 25, the first lead 12 and the first electrode 16. The intermetallic phases 50 have a higher melting temperature than the solder material used to generate the intermetallic phases 50. The temperature in the oven is set such that it is lower than the melting temperature of the intermetallic phases 50. In one embodiment, the melting temperature of the intermetallic phases 50 is higher than 300° C. Thus, the intermetallic phases 50 may solidify while they are still in the oven.

Since the process described above is diffusion-controlled, its duration increases as the thickness of the layer of the solder material rises. Due to the protrusions 28 extending from the contact areas 26, 27 towards the first lead 12 and the first electrode 16, respectively, there is only a thin layer of solder material between the bottom surfaces of the protrusions 28 and the top surface of the first lead 12 or the first electrode 16. In this areas the low-melting solder material is thus completely transformed into the intermetallic phases 50 at first. Since the components are placed in the oven for not longer than 60 seconds, the portions of the solder material between neighboring protrusions 28 are not transformed into the intermetallic phase 50. Thus, when the components are taken out from the oven, the interfaces between the contact clip 25 and the first lead 12 and between the contact clip 25 and the first electrode 16 have the structure as shown in the enlarged illustration at the bottom of FIG. 3E. There are only intermetallic phases 50 where the gap between the contact clip 25 and the first lead 12 or the first electrode 16 is in the range from 1 to 2 µm. In the remaining areas the solder material has not completely transformed into an intermetallic phase. Due to the intermetallic phases 50 the contact clip 25 is firmly attached to the first lead 12 and the semiconductor chip 15.

FIG. 3F schematically illustrates that before or after the attachment of the contact clip 25 to the first lead 12 and the semiconductor chip 15, an electrical interconnection is established between the third electrode 18 of the semiconductor chip 15 and the third lead 14. This interconnection is made by wire bonding as illustrated in FIG. 3F. For example, ball bonding or wedge bonding is used as the interconnect technique to produce one or more bond wires 51. The bond wire 51 is made of gold, aluminum, copper or any other appropriate electrically conductive material.

Instead of wire bonding, a contact clip is placed on the third electrode 18 and the third lead 14 in one embodiment. The contact clip may have protrusions extending from its contact areas similar to the protrusions 28 of the contact clip 25.

FIG. 3G schematically illustrates a mold material 52 that encapsulates the components arranged on the leadframe 10. The mold material 52 may encapsulate any portion of the device 300, but leaves the upper surface of the contact clip 25 and parts of the leads 12-14 uncovered. Furthermore, parts of the die pad 11 may not be covered with the mold material 52, in particular, the bottom surface of the die pad 11. The top surface of the mold material 52 may form a plane together with the top surface of the contact clip 25 as illustrated in FIG. 3G. In one embodiment, the mold material 52 also covers the top surface of the contact clip 25.

The mold material 52 may be composed of any appropriate thermoplastic or thermosetting material, in particular, it may be composed of a material commonly used in contemporary semiconductor packaging technology. Various techniques may be employed to cover the components of the device 300 with the mold material 52, for example, compression molding, injection molding, powder molding or liquid molding.

Before or after the encapsulation with the mold material 52, the individual devices 300 are separated from one another by separation of the leadframe 10, for example, by sawing or cutting the dams of the leadframe 10. Other separation methods, such as etching, milling, laser ablation or stamping, may also be employed.

FIG. 3H schematically illustrates that the leads 12-14 are bent, for example, in an S-shape manner to form a step as depicted in FIG. 3H. Bending the leads 12-14 may, for example, be carried out in the course of a trim and form process. In one embodiment, the ends of the leads 12-14 are bent in the direction of the contact clip 25. The leads 12-14 are bent such that their top surfaces 53, 54 and 55, respectively, (illustrated in FIG. 3H by dashed lines) are arranged in a plane 56, which is defined by the exposed top surface of the contact clip 25 and the top surface of the mold material 52. Other arrangements of the leads 12-14 are also possible.

The leads 12-14 and, in particular, the contact clip 25 serve as external contact elements of the device 300, wherein the leads 12-14 are coupled to the first electrode 16, the second electrode 17 and the third electrode 18 of the semiconductor chip 15, respectively. The surfaces 53-55 of the leads 12-14 and the exposed surface of the contact clip 25 may be used as external contact surfaces to electrically couple the device 300 to other components, for example, a circuit board, such as a PCB. The surface 56 of the device 300 may be used as a mounting surface to mount the device 300 on the circuit board.

It is obvious to a person skilled in the art that the device 300 is only intended to be an exemplary embodiment, and many variations are possible. Although the device 300 in the embodiment illustrated in FIG. 3H includes exactly one semiconductor chip, the device 300 may include two or more semiconductor chips and/or passives. The semiconductor chips and passives may differ in function, size, manufacturing technology etc. For example, a semiconductor chip controlling the semiconductor chip 15 and/or a further power semiconductor chip may be included in the device 300.

One method to produce the protrusions 28 on the contact areas 26, 27 of the contact clip 25 is to use a metal forming manufacturing process. In this process a stamping press produces the desired pattern on the contact clip 25.

Figure 4A:
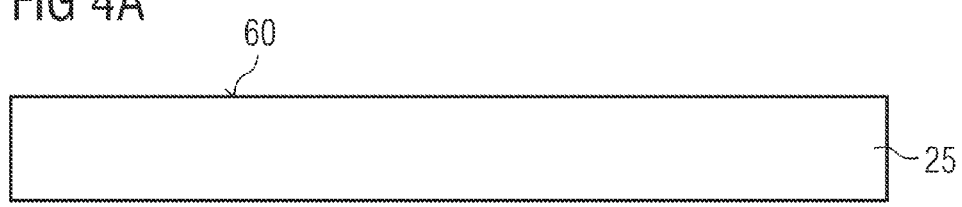
FIGS. 4A-4D schematically illustrate a cross-sectional view of one embodiment of a method of manufacturing a contact clip having a plurality of protrusions extending from contact areas.
Figure 4B:
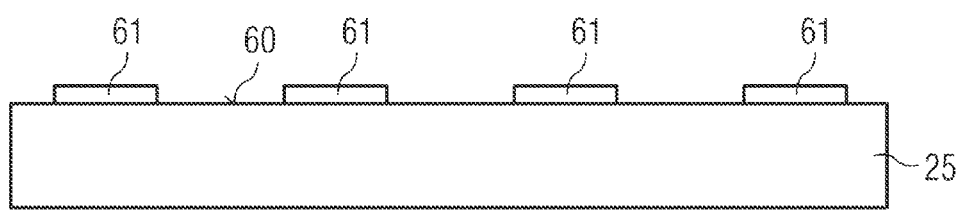

FIGS. 4A-4D schematically illustrate a further method to produce the protrusions 28 on the contact areas 26, 27. Firstly the contact clip 25 is provided, wherein a contact area of the contact clip 25 is illustrated in FIG. 4A. In this state, the contact area has an even main surface 60. Then an etching mask 61 is deposited on the main surface 60 of the contact area as illustrated in FIG. 4B. For this purpose, a resist film is laminated on the main surface 60 of the contact area, which is photostructurable. Recesses are formed in the resist film by exposure to light having a suitable wave-length through a mask and subsequent development. The resist film has then the shape as illustrated in FIG. 4B.

Figure 4C:
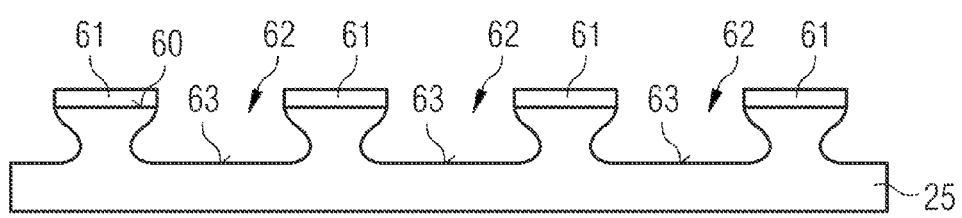
Figure 4D:
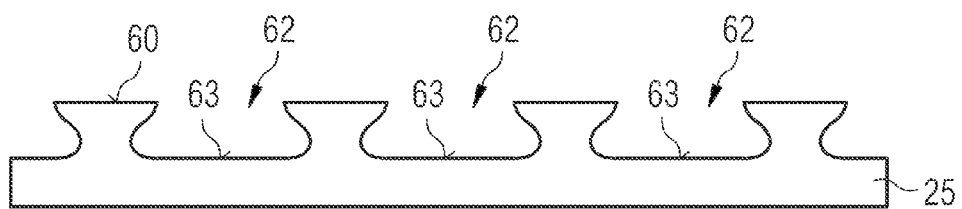

Subsequently, the main surface 60 of the contact area is exposed to an appropriate etching agent for a suitable time. Thereby the portions of the contact clip 25 that are exposed from the etching mask 61 are etched and cavities 62 are formed as illustrated in FIG. 4C. Due to the etching process, the side walls of the cavities 62 have a curved surface rather than a planar surface. The cavities 62 are formed such that the main surface 60 of the contact clip 25 overlaps portions of the base surface 63 of the cavities 62. Afterwards the resist film is stripped off, and the structured contact clip 25 is obtained as illustrated in FIG. 4D, which may be used to manufacture the device 300 as illustrated in FIGS. 3A-3H.

Figure 5:
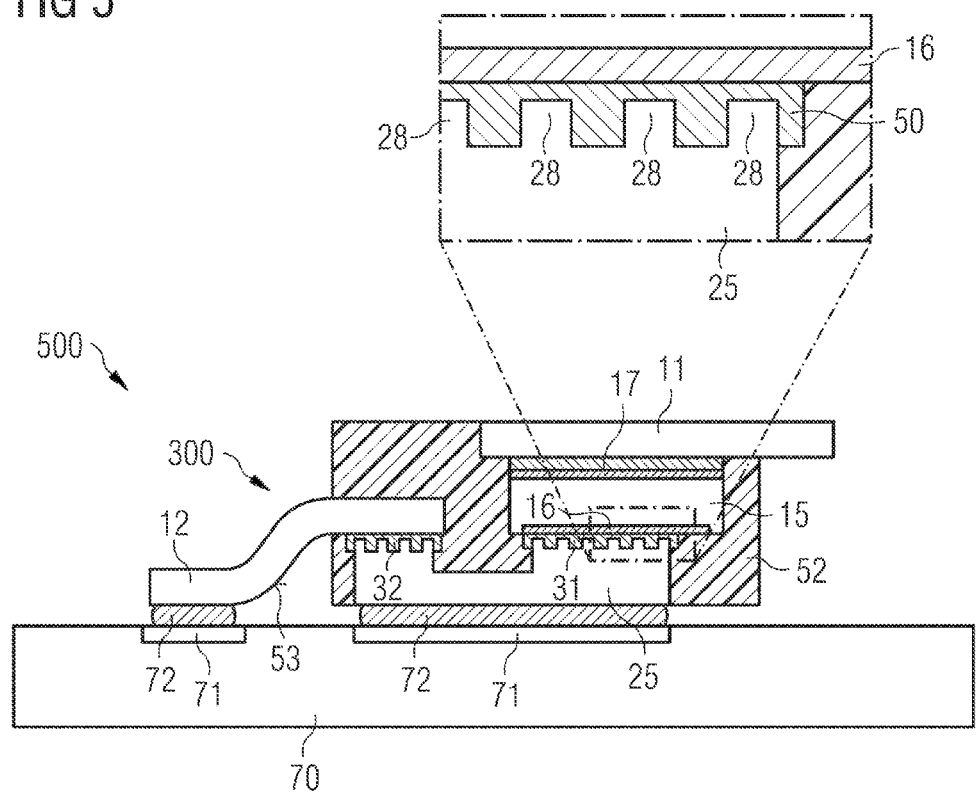
FIG. 5 schematically illustrates a cross-sectional view of one embodiment of a system including a semiconductor device mounted on a circuit board.

FIG. 5 schematically illustrates a cross-sectional view of a system 500 including the device 300 mounted on a circuit board 70, for example, a PCB. The circuit board 70 includes contact pads 71 to which the leads 12-14 and the exposed surface of the contact clip 25 of the device 300 are attached using solder deposits 72. On top of the device 300, a heat sink may be attached.

In one embodiment, the device 300 is placed in an oven and is exposed there to a temperature which is higher than the melting temperature of the solder material of the layers 31, 32. The temperature in the oven may be in the range from 280 to 320° C. and, in particular, around 300° C. The device 300 is kept in the oven for an appropriate time so that the solder material of the layers 31, 32 is completely transformed into the intermetallic phase 50. This process is carried out after the device 300 has been separated from the other devices by separation of the leadframe 10 and before the device 300 is placed on the circuit board 70 or, alternatively, after the device 300 has been placed on the circuit board 70.

In one embodiment, the device 300 is not placed in an oven as described above. Thus the layers 31, 32 of solder material are not completely transformed into the intermetallic phase 50 after the device 300 has been mounted on the circuit board 70. In this embodiment, during operation of the device 300, the heat generated by the semiconductor chip 15 and, in particular, other components of the device 300 or the system 500 produces a temperature that is high enough to completely transform the solder material of the layers 31, 32 into the intermetallic phase 50 as shown in the enlarged illustration at the top of FIG. 5.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A semiconductor device, comprising:
a die pad;
a first lead proximate the die pad;
a semiconductor chip disposed over the die pad and comprising a first electrode on a first major surface and a second electrode on a second major surface, the second electrode facing the die pad;
a contact clip electrically coupling the first electrode with the first lead, the contact clip comprising a first contact area and a second contact area, wherein the first contact area is disposed over the first lead and the second contact area is disposed over the first electrode;
a first plurality of protrusions disposed on the first contact area of the contact clip, the first plurality of protrusions overlapping with and facing the first lead, the first plurality of protrusions comprising first peaks and first valleys;
a first solder layer disposed between the first contact area and the first lead, the first solder layer disposed within the first valleys of the first plurality of protrusions, the first valleys physically contacting the first solder layer, the first solder layer physically contacting the first lead; and
a first intermetallic region disposed between the first lead and the first peaks, the first peaks physically contacting the first intermetallic region, the first lead physically contacting the first intermetallic region.
2. The device of claim 1, further comprising:
a second plurality of protrusions disposed on the second contact area, the second plurality of protrusions overlap- ping with and facing the first electrode, the second plurality of protrusions comprising second peaks and second valleys;

a second intermetallic region disposed between the first electrode and the second peaks, the second peaks physically contacting the second intermetallic region, the first electrode physically contacting the second intermetallic region; and a second solder layer disposed between the second contact area and the first electrode, the second solder layer disposed within the second valleys of the second plurality of protrusions the second valleys physically contacting the second solder layer, the second solder layer physically contacting the first electrode.

3. The device of claim 1, wherein the first plurality of protrusions extend from one side surface of the contact clip to an opposite side surface of the contact clip.

4. The device of claim 1, wherein the semiconductor chip is a power semiconductor chip.

5. The device of claim 1, further comprising a second lead proximate the die pad electrically coupled to the die pad.

6. The device of claim 1, wherein the first and second contact areas each have the shape of a comb.

7. The device of claim 1, wherein the first intermetallic region comprises a higher melting temperature than the first solder layer.

8. The device of claim 1, wherein the contact clip and the first plurality of protrusions are made of the same material.

9. The device of claim 1, wherein the contact clip and the first plurality of protrusions are formed in one piece.

10. The device of claim 1, wherein the entire first contact area is in contact with and coupled to the first lead and the entire second contact area is in contact with and coupled to the first electrode.

11. The device of claim 1, each of the first plurality of protrusions comprises a height of at least 5 µm.

12. The device of claim 1, wherein each of the first plurality of protrusions comprise sidewalls having curved surfaces.

13. A semiconductor device, comprising:
a die pad;
a lead;
a semiconductor chip arranged over the die pad and comprising an electrode arranged over a surface facing away from the die pad;
a contact clip electrically coupling the electrode and the lead, wherein the contact clip comprises a first contact area arranged over the lead and a second contact area arranged over the electrode;
a plurality of protrusions disposed over the second contact area of the contact clip, the plurality of protrusions overlapping with and facing the electrode, the plurality of protrusions comprising peaks and valleys;

a solder layer arranged between the electrode and the valleys, the valleys physically contacting the solder layer, the electrode physically contacting the solder layer; and an intermetallic region arranged between the electrode and the peaks, the peaks physically contacting the intermetallic region, the electrode physically contacting the intermetallic region.

14. The device of claim 13, wherein the semiconductor chip is a power semiconductor chip.

15. The device of claim 13, wherein the semiconductor chip further comprises another electrode arranged over another surface facing towards the die pad.

16. The device of claim 13, further comprising a second lead proximate the die pad electrically coupled to the die pad.

17. The device of claim 13, wherein the first and second contact areas each have the shape of a comb.

18. The device of claim 13, wherein the intermetallic region comprises a higher melting temperature than the solder layer.

19. The device of claim 13, wherein the contact clip and the plurality of protrusions are made of the same material.

20. The device of claim 13, wherein the contact clip and the plurality of protrusions are formed in one piece.

21. The device of claim 13, wherein the entire first contact area is in contact with and coupled to the lead and the entire second contact area is in contact with and coupled to the electrode.

22. A semiconductor device, comprising:
a die pad;
a lead;
a semiconductor chip arranged over the die pad and comprising an electrode arranged over a surface facing away from the die pad;
a contact clip electrically coupling the electrode and the lead, wherein the contact clip comprises a first contact area arranged over the lead and a second contact area arranged over the electrode;
a plurality of protrusions disposed over the first contact area of the contact clip, the plurality of protrusions overlapping with and facing the lead, the plurality of protrusions comprising peaks and valleys;
a solder layer arranged between the lead and the valleys, the valleys physically contacting the solder layer, the lead physically contacting the solder layer; and
an intermetallic region arranged between the lead and the peaks, the peaks physically contacting the intermetallic region, the lead physically contacting the intermetallic region.

* * * * *